United States Patent
Chou et al.

(10) Patent No.: US 6,187,652 B1
(45) Date of Patent: Feb. 13, 2001

(54) METHOD OF FABRICATION OF MULTIPLE-LAYER HIGH DENSITY SUBSTRATE

(75) Inventors: William T. Chou, Cupertino; Solomon I. Beilin, San Carlos; Michael Guang-Tzong Lee, San Jose; Michael G. Peters, Santa Clara; Wen-Chou Vincent Wang, Cupertino, all of CA (US)

(73) Assignee: Fujitsu Limited (JP)

( * ) Notice: Under 35 U.S.C. 154(b), the term of this patent shall be extended for 0 days.

(21) Appl. No.: 09/152,365

(22) Filed: Sep. 14, 1998

(51) Int. Cl.[7] .............................. H01L 21/30; H01L 21/46
(52) U.S. Cl. ..................... 438/455; 438/459; 257/698; 257/700
(58) Field of Search .................. 29/830, 834, 872; 438/455, 459, 66, 67; 257/685, 698, 700

(56) References Cited

U.S. PATENT DOCUMENTS

| | | | |
|---|---|---|---|
| 3,755,890 | * 9/1973 | Klehm, Jr. | 29/625 |
| 4,258,468 | 3/1981 | Balde | 29/830 |
| 4,668,088 | 5/1987 | Quinque et al. | 356/138 |
| 4,714,516 | 12/1987 | Eichelberger et al. | 156/628 |
| 4,764,485 | 8/1988 | Loughran et al. | 437/225 |
| 4,894,115 | 1/1990 | Eichelberger et al. | 156/643 |
| 4,916,809 | 4/1990 | Boudou et al. | 29/852 |
| 5,022,960 | 6/1991 | Takeyama et al. | 156/643 |
| 5,255,431 | 10/1993 | Burdick | 29/840 |
| 5,263,243 | 11/1993 | Taneda et al. | 29/830 |
| 5,347,712 | 9/1994 | Yasuda et al. | 29/852 |
| 5,355,283 | * 10/1994 | Marrs et al. | 361/760 |
| 5,379,515 | 1/1995 | Kondo et al. | 29/852 |
| 5,478,700 | 12/1995 | Gaynes et al. | 430/315 |
| 5,566,448 | 10/1996 | Bhatt et al. | 29/840 |
| 5,584,956 | 12/1996 | Lumpp et al. | 156/272.8 |
| 5,657,537 | * 8/1997 | Saia et al. | 29/830 |
| 5,703,400 | * 12/1997 | Wojnarowski et al. | 257/723 |
| 5,745,984 | * 5/1998 | Cole, Jr. et al. | 29/834 |
| 5,880,010 | * 3/1999 | Davidson | 438/455 |

OTHER PUBLICATIONS

Seraphim, et al. Principles of Electronic Packaging, McGraw–Hill: New York, 1989, pp. 353, 527, 596–597, 1989.*

* cited by examiner

Primary Examiner—Charles Bowers
Assistant Examiner—Erik J Kielin
(74) Attorney, Agent, or Firm—Coudert Brothers

(57) ABSTRACT

A method of fabricating a multi-layer interconnected substrate structure. The inventive method includes forming a multi-layer structure from multiple, pre-fabricated power and/or signal substrates which are laminated together. A drill is then used to form a via through the surface of a ring-type pad down to a desired depth in the multi-layer structure. The via hole is cleaned and then filled with a conductive material. The via so formed between two or more substrates is self-aligned by using the ring pad(s). This contributes to an increased signal routing density compared to conventional methods.

18 Claims, 2 Drawing Sheets

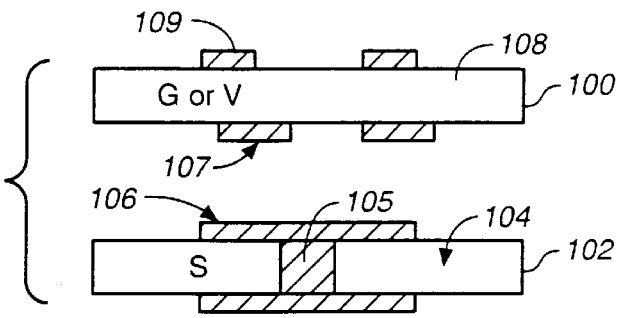
FIG._1
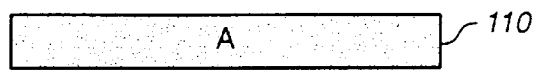
FIG._2
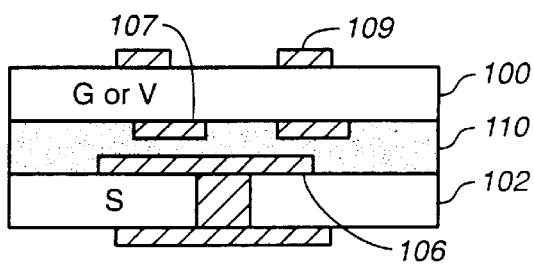
FIG._3
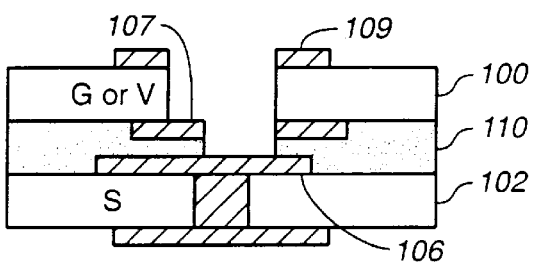
FIG._4
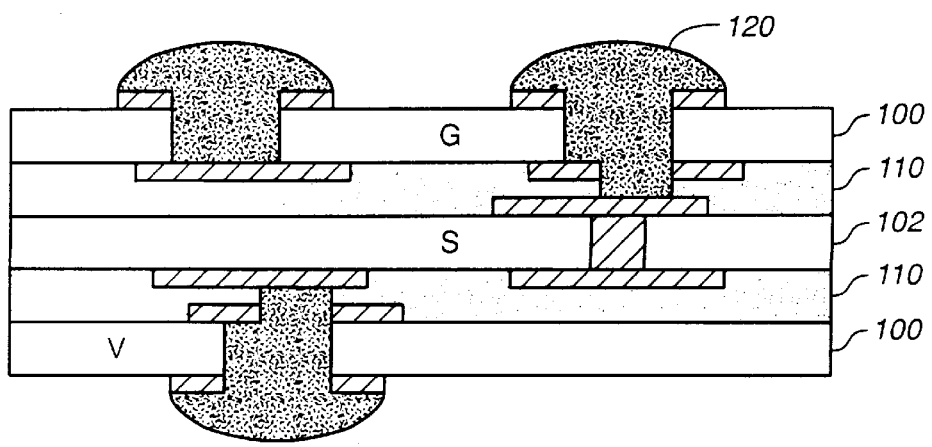
FIG._5

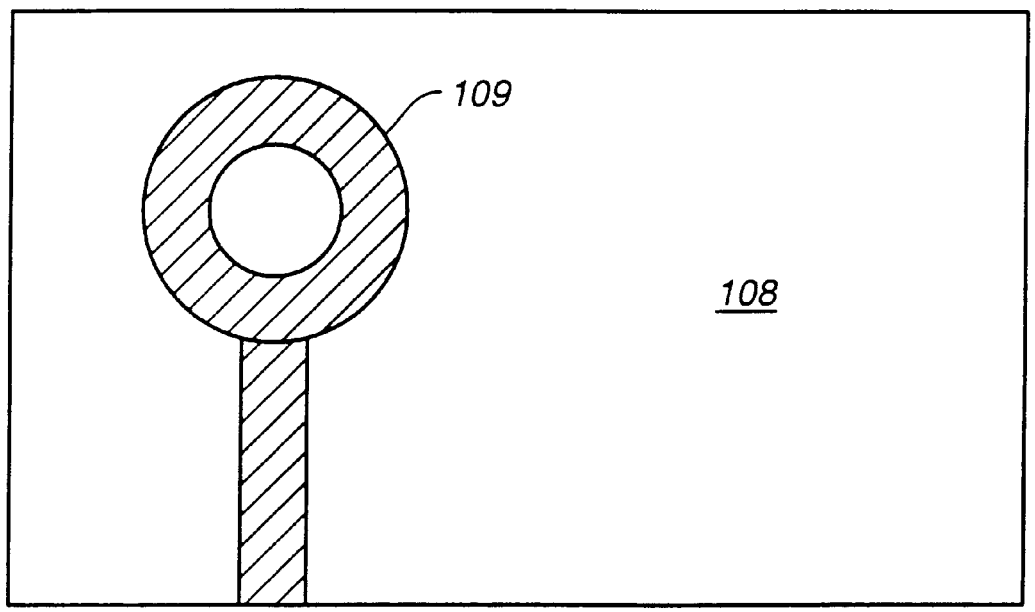
FIG._6

METHOD OF FABRICATION OF MULTIPLE-LAYER HIGH DENSITY SUBSTRATE

BACKGROUND OF THE INVENTION

1. Field of the Invention

The present invention relates to the fabrication of semiconductor devices, and more specifically, to a method of fabricating a multiple-layer, interconnected substrate for use in the manufacture of single or multiple chip packages.

2. Description of the Prior Art

Multiple-layer, interconnected substrates are used in the manufacture of multi-chip modules (MCM) and single-chip modules (SCM), and in chip-scale packaging (CSP). The interconnected substrates may be rigid or flexible and are used to provide signal paths, power distribution paths, and interconnections between locations on the substrates. Use of multiple layers facilitates an increase in the density of integrated circuits (ICs) which can be mounted on the top substrate because it permits signal and power lines to be placed on layers other than that on which the ICs are mounted.

The use of multiple substrate layers requires that a method be developed for interconnecting the substrates to enable signals and power to be routed between the pins of different ICs and between the IC pins and connections on the package. One way in which this is conventionally achieved is by forming a through hole that extends through vertically aligned regions on different substrate layers. The through hole is typically formed by a mechanical or laser drill, or plasma etching, for example, with the hole being plated to provide a conductive interconnection between the layers.

However, there are several disadvantages to this conventional method. The method is limited with regards to the substrate and conductive materials with which it may be used. Also, it is a single-sided process and is not suitable for forming double-sided connections (i.e., conductive connections to an intermediate layer from above and below that layer). In addition, this method does not permit selective interconnection to only those layers requiring it, since the through hole extends through all of the layers.

Another conventional method for forming a multi-layer interconnected substrate is to pattern the via hole(s) in each of the individual layers and fill the via hole(s) with a conductive material prior to assembling them into the final structure. This method has the disadvantage that all of the layers must be carefully aligned prior to laminating them together. This means that the feature routing density achievable is limited by the need to provide for sufficient registration tolerance between the layers of the structure. In addition, this method requires a greater number of processing steps than may be feasible or efficient for process flows in which it is desired to be incorporated.

What is desired is a method of fabricating a multi-layer interconnected substrate having a higher feature routing density than can be achieved with conventional process flows.

SUMMARY OF THE INVENTION

The present invention is directed to a method of fabricating a multi-layer interconnected substrate structure. The inventive method includes forming a multi-layer structure from multiple, pre-fabricated power and/or signal substrates which are laminated together. A drill is then used to form a via hole through the surface of a ring-type pad down to a desired depth in the multi-layer structure. The via hole is cleaned and then filled with a conductive material. The via so formed between two or more substrates is self-aligned by using the ring pad(s). This contributes to an increased signal routing density compared to conventional methods. In addition, the inventive method is compatible with a wider variety of substrate and conductive materials than conventional approaches to fabricating similar structures.

BRIEF DESCRIPTION OF THE DRAWINGS

FIGS. 1 through 5 are cross-sectional side views illustrating the process flow for interconnecting two layers of a multi-layer structure according to the method of the present invention.

FIG. 6 shows a plan view of a ring-shaped conductive pad on a dielectric layer. In FIG. 6, a ring- or donut-shaped pad 109 is on a dielectric substrate 108.

DETAILED DESCRIPTION OF THE INVENTION

The present invention is directed to a method for fabricating a multi-layer, interconnected substrate structure. The method is described in the context of interconnecting a surface pad located on the uppermost substrate or layer of a multi-layer structure to a buried pad located on a lower layer. The inventive method permits the interconnection to be made with a reduced via and pad size compared to conventional methods. This permits an increase in interconnection (or generally, feature) density compared to conventional methods.

FIGS. 1 through 5 are cross-sectional side views illustrating the process flow for interconnecting two layers of a multi-layer structure according to the method of the present invention. As shown in FIG. 1, two separate substrate elements 100 and 102 are first fabricated independently of each other. The substrate elements may be of a type used to route signals (an S-type substrate, such as element 102), or of a type used in the routing of power (a G- or V-type substrate, such as element 100). Substrate elements 100 and 102 may be fabricated using a conventional process or processes which are suitable for rigid or flexible printed circuit boards.

In the example shown in FIG. 1, the first substrate element is a S-type substrate and the second substrate element is a G- or V-type substrate, although this is for purposes of example only. The inventive method is not limited to this arrangement and other combinations and types of substrate elements may be interconnected using the method.

The S-type substrate 102 shown in the figure is a dielectric substrate 104 on each side of which is patterned a metal conductor with conductive pads 106 arranged over each side of a connecting via 105. The G- or V-type substrate 100 is a dielectric substrate 108 on which is patterned a ring- or donut-shaped pad 109 formed from a conductive material. A plan view of element 100 showing the conductive ring-shaped pad 109 is shown in FIG. 6. As shown in the figure, a pad or pads 107 may optionally be formed on a second surface of this substrate. Ring pad 109 is formed using conventional semiconductor processing techniques in the locations on substrate 100 where it is desired to form an interconnection between layers of the final multi-layer structure.

An adhesive layer (shown in FIG. 2 as substrate "A", element 110) is used to laminate substrate elements 100 and 102 together. The two substrate elements are aligned to each other with the adhesive in between, and then the lamination is performed using a press machine, although other methods may be used. The resulting structure is shown in FIG. 3. Note that although FIG. 3 illustrates a single G- or V-type substrate 100 laminated to a single S-type substrate 100, the inventive method is applicable to other structures. These include a multi-layer structure formed from a G- or V-type substrate laminated on either side of a S-type substrate using two layers of adhesive 110 (such as is shown in FIG. 5).

As noted, the pads of each substrate element are aligned with respect to each other during the lamination process. A positional measurement step may be performed after the lamination process to determine the precise location(s) of the surface pads of the G- or V-type substrates. With reference to FIG. 4, a numerically controlled laser (or other suitable drilling method) is then used to drill a via hole through the pad(s) 107, 109. The drilling operation is stopped at the surface of the S-type substrate, i.e., it is controlled so that the laser does not drill into the buried metal pad 106 of the substrate. As is known, the parameters of the laser drilling operation can be varied to etch away the dielectric and adhesive materials encountered by the laser beam without damaging the conductive pads. A plasma based process may also be used to drill the desired hole(s). The via hole(s) may then be cleaned with a wet chemical or plasma etch process to remove any residue(s).

The ring type pad(s) of substrate 100 serve as a hard mask for the laser drilling step. The laser drilling forms a self-aligned via extending from the G- or V-substrate through the adhesive layer to the S-type substrate. The resulting structure is shown in FIG. 4.

The via hole so formed is then filled with a conductive material. Methods of filling the via hole include: (1) electroless plating to "wet" the surfaces of the via, followed by screen printing of solder or paste materials; (2) direct deposition of solder ball(s); or (3) electroless plating or vacuum deposit of a metal seed layer, followed by patterning of a photoresist layer and selective plating of solder or metal to form the desired conductive structure. Possible metals for plating include copper, nickel, gold, or combinations of such metals. The resulting structure is shown in FIG. 5, where element 120 represents the conductive filler for the via. As shown in the figure, the inventive method permits hole formation of a conductive interconnect between the top or bottom substrate or layer of a multi-layer structure and a pad on an intermediate layer.

The material from which the substrate elements 100 and/or 102 may be formed include, but are not limited to, flexible substrates formed from polymide, polyester, fluoropolymer, or polyaramide, and rigid substrate materials known in the semiconductor industry. The adhesive used in the lamination process may include, but is not limited to, polyester, acrylic, phenolic, epoxy, polyimide, or fluoropolymer.

Advantages of the present invention relative to conventional methods include:

(1) The alignment procedure prior to lamination of the substrate elements does not have to be tightly controlled. The via hole formed by the laser drilling to interconnect the two substrate types is self-aligned and the via hole size is determined by the overlapping area of the pads on the two substrate elements. Since the formed via hole is self-aligned, the number of alignment steps are reduced. The feature routing density achievable is not limited by the need to provide wide pads and vias to accommodate highly a cumulative registration tolerance as in many conventional methods. This contributes to the small pad size which can be used and the higher signal routing density which can be obtained by the invention;

(2) The present invention does not require a planarization step during the via hole fill and connection steps. This is because the via hole fill and connection is steps are performed after lamination of the layers together;

(3) No additional process steps are required when laminating a via connected substrate, such as the S-type substrate element;

(4) Solder can be used as the interconnection (via hole fill) material. Solder flux can be used and cleaned away with the open structure of the present invention; and (5) Flexible or rigid substrates, or combinations of such substrate types may be used with the inventive method.

The inventive method provides a high-feature density compared to conventional methods and is capable of forming vias only between the layers of a multilayer structure that require interconnection. The inventive method requires fewer processing steps than some conventional methods, can be used to form double-sided connections to an intermediate substrate, and is not as limited in choice of conductive and substrate materials as the conventional methods described.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

What is claimed is:

1. A method of fabricating a multi-layer substrate, comprising:

providing a first substrate element having an upper and a lower surface and a conductive pad arranged on the upper surface of the element, wherein the conductive pad is in the form of at least a portion of a ring;

providing a second substrate element having an upper and a lower surface and a conductive pad arranged on each of the upper and lower surfaces, and a conductive via which connects the conductive pads on the upper and the lower surfaces of the second substrate element;

vertically aligning the conductive pad of the first substrate element to the conductive pad of the second substrate element;

laminating the first substrate element to the second substrate element;

drilling a via hole extending through the conductive pad of the first substrate element to the conductive pad of the second substrate element, wherein the conductive pad of the second substrate element stops the drilling; and filling the via hole with a conductive material.

2. The method of claim 1, wherein filling the via hole with the conductive material comprises:

plating the surface defining the via hole with the conductive material.

3. The method of claim 1 wherein the first and second substrate elements are flexible.

4. The method of claim 1, wherein the step of laminating the first substrate element to the second substrate element further comprises:

disposing an adhesive layer between the first and second substrate elements; and causing the first and second substrate elements to adhere to opposite sides of the adhesive layer.

5. The method of claim 1, wherein the conductive material comprises solder.

6. The method of claim 1, wherein the step of drilling the via hole comprises:

drilling the via hole with a laser drill.

7. The net nod of claim 1, wherein the step of drilling the via hole comprises:

drilling the via hole with a plasma process.

8. The method of claim 1, further comprising the step of:

cleaning the via hole after the via hole is formed to remove residues. lease add the following new claims.

9. The method of claim 1 wherein the conductive pad of the first substrate element is in the form of a ring.

10. A method of fabricating a multi-layer substrate, comprising:

providing a first substrate element having opposing surfaces and a ring-shaped pad at one of the opposing surfaces, wherein the first substrate element is a G- or V-type substrate;

providing a second substrate element having opposing surfaces and a conductive pad at one of the surfaces of the second substrate element, wherein the second substrate element is a S-type substrate;

aligning the ring-shaped conductive pad of the first substrate element to the conductive pad of the second substrate element;

laminating the first substrate element to the second substrate element to form a laminated structure, wherein the ring-shaped pad of the first substrate element is at an outer surface of the laminated structure and the conductive pad of the second substrate element is buried within the laminated structure;

forming a via hole extending through the ring-shaped conductive pad of the first substrate element to the conductive pad of the second substrate element so that the via hole stops at the conductive pad on the second substrate element; and filling the via hole with a conductive material.

11. The method of claim 10 wherein the first and second substrate elements are flexible.

12. The method of claim 10 wherein forming the via hole comprises laser drilling.

13. The method of claim 10 wherein filling the via hole with the conductive material comprises:

electroless plating surfaces defining the via hole; and depositing solder in the via hole.

14. The method of claim 10 wherein laminating the first substrate element to the second substrate element comprises:

disposing an adhesive layer between the first and second substrate elements; and causing the first and second substrate elements to adhere to the adhesive layer.

15. The method of claim 14 wherein forming the via hole comprises drilling through the adhesive layer.

16. The method of claim 10 wherein the ring-shaped pad of the first conductive element is a first ring-shaped pad, and wherein the first conductive element further comprises a second ring-shaped pad at the opposite side of the first conductive element as the first ring-shaped pad.

17. The method of claim 10 wherein the first and second substrate elements comprise polyimide.

18. The method of claim 10 further comprising:

cleaning the via hole with a plasma etch after drilling the via hole.

* * * * *